United States Patent [19]
Hara et al.

[11] Patent Number: 5,530,640
[45] Date of Patent: Jun. 25, 1996

[54] IC SUBSTRATE AND BOOSTED VOLTAGE GENERATION CIRCUITS

[75] Inventors: Motoko Hara; Takeshi Kajimoto, both of Hyogo-ken, Japan

[73] Assignee: Mitsubishi Denki Kabushiki Kaisha, Tokyo, Japan

[21] Appl. No.: 135,514

[22] Filed: Oct. 13, 1993

[30] Foreign Application Priority Data

Oct. 13, 1992 [JP] Japan .................................. 4-274258

[51] Int. Cl.⁶ .................................................. H02M 3/18
[52] U.S. Cl. .......................... 363/60; 327/534; 327/536
[58] Field of Search ...................... 363/59, 60; 327/534, 327/535, 536

[56] References Cited

U.S. PATENT DOCUMENTS

| | | |
|---|---|---|
| 4,438,346 | 3/1984 | Chuang et al. ........................ 307/297 |
| 4,904,885 | 2/1990 | Yamada et al. ....................... 307/296.2 |
| 5,038,325 | 8/1991 | Douglas et al. ..................... 365/189.06 |

*Primary Examiner*—Peter S. Wong
*Assistant Examiner*—Adolf Berhane
*Attorney, Agent, or Firm*—Lowe, Price, LeBlanc & Becker

[57] ABSTRACT

A voltage generation circuit has a charge pump circuit, a clamping circuit for clamping an output voltage of the charge pump circuit, and detecting means for detecting the output voltage of the charge pump circuit and supplying a control signal for boosting the output voltage to the charge pump circuit when the detected output voltage is lower than a reference voltage, wherein the detecting means includes a circuit for stopping supply of a control signal. This circuit stops supply of the control signal to the charge pump circuit when the clamping circuit is in operation.

11 Claims, 4 Drawing Sheets

IC SUBSTRATE AND BOOSTED VOLTAGE GENERATION CIRCUITS

BACKGROUND OF THE INVENTION

1. Field of the Invention

The present invention relates generally to voltage generation circuits generating a predetermined voltage and, particularly to a voltage generation circuit provided with at least a detecting circuit, a charge pump circuit and a clamping circuit.

2. Description of the Background Art

In a semiconductor integrated circuit device, a voltage generation circuit is provided for generating an internal voltage such as a boosted voltage $V_{PP}$ and a substrate voltage $V_{BB}$.

Figure 7:
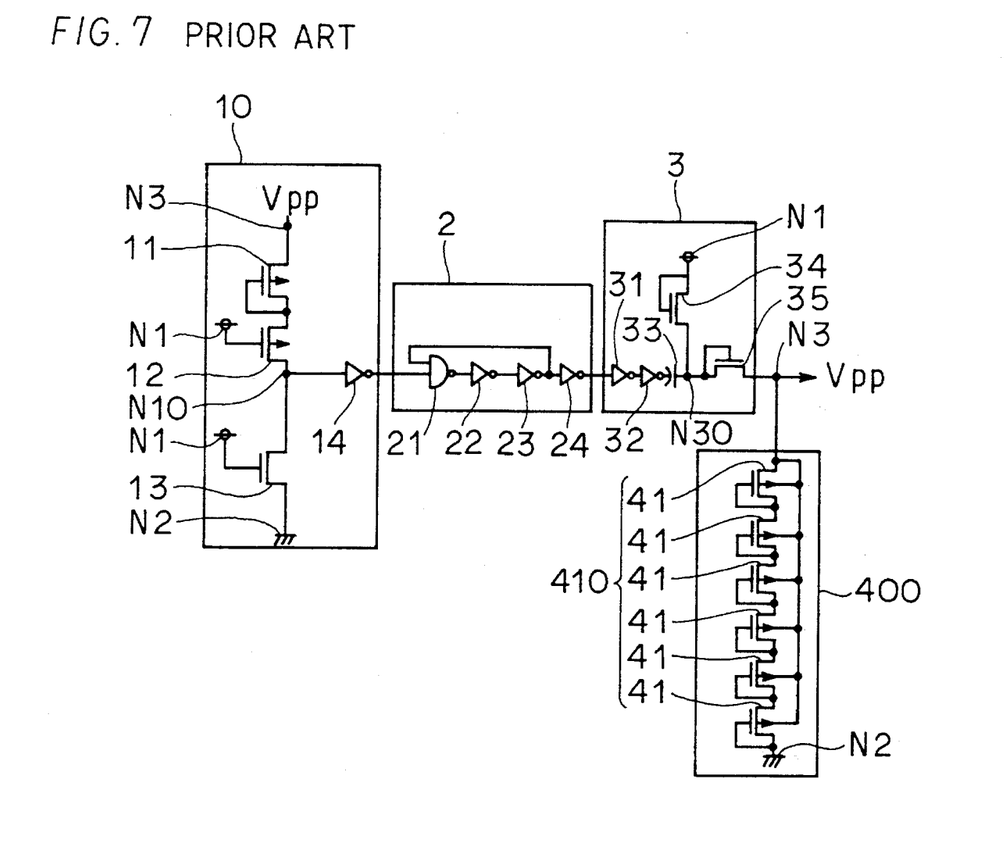
FIG. 7 is a circuit diagram of a conventional voltage generation circuit.

FIG. 7 is a circuit diagram of a boosted voltage generation circuit as an example of a conventional voltage generation circuit. Referring to FIG. 7, the voltage generation circuit includes a detecting circuit 10, a ring oscillator 2, a charge pump circuit 3 and a clamping circuit 400. A power supply node N1 receives a power supply voltage $V_{CC}$. A ground node N2 receives a ground voltage. An output node N3 receives and outputs a boosted voltage $V_{PP}$ which is an output voltage from charge pump circuit 3.

Detecting circuit 10 includes P channel transistors 11 and 12, an N channel transistor 13 and an inverter 14.

Transistors 11, 12 and 13 are connected in series between output node N3 and ground node N2. Transistor 11 has its gate connected to a node between transistors 11 and 12. Respective gates of transistors 12 and 13 are connected to power supply node N1. A node N10 between transistors 12 and 13 is connected through inverter 14 to one input node of an NAND gate 21 in ring oscillator 2, which will be described later.

Ring oscillator 2 includes NAND gate 21 and inverters 22, 23 and 24. NAND gate 21 and inverters 22, 23 and 24 are connected in series between inverter 14 in detecting circuit 10 and an inverter 31 in charge pump circuit 3, which will be described later. A node between inverters 23 and 24 is connected to the other input node of NAND gate 21.

Charge pump circuit 3 includes inverters 31 and 32, a capacitor 33, and N channel transistors 34 and 35. Between inverter 24 in ring oscillator 2 and output node N3, inverters 31 and 32, capacitor 33 and transistor 35 are connected in series. Transistor 35 has its gate connected to a node N30 between capacitor 33 and transistor 35.

Between power supply node N1 and the node between capacitor 33 and transistor 35, transistor 34 is connected. Transistor 34 has its gate connected to power supply node N1.

Clamping circuit 400 includes a group of transistors 410 provided between output node N3 and ground node N2. Group of transistors 410 includes six P channel transistors 41. These transistors 41 are connected in series between output node N3 and ground node N2.

In the group of transistors 410, a transistor 41 connected to ground node N2 has its gate connected to ground node N2. Each of the remaining transistors 41 has its gate connected to each node between that transistor 41 itself and an adjacent transistor 41 at the side of ground node N2.

The operation of this voltage generation circuit will be described.

At first, the operation of detecting circuit 10 will be described. In detecting circuit 10, a detection level is set based on a power supply voltage $V_{CC}$ and threshold voltages $V_{TH}$ of respective transistors 11 and 12. The detection level is a reference voltage for detection as to whether the boosted voltage $V_{PP}$ has exceeded a predetermined value. The detection level is, specifically, $V_{CC}+2|V_{TH}|$. In detecting circuit 10, transistor 13 is normally in on-state.

When the boosted voltage $V_{PP}$ is not higher than the detection level, both of transistors 11 and 12 are turned off. In this case, a logic level of node N10 attain a low level. As a result, a logic level of an output signal from inverter 14 attains a high level.

In contrast, when the boosted voltage $V_{PP}$ is higher than the detection level, both of-transistors 11 and 12 are turned on. In this case, the logic level of node N10 attains a high level. As a result, the logic level of the output signal from inverter 14 attains a low level.

Therefore an output signal from detecting circuit 10 attains a high level when the boosted voltage $V_{PP}$ is not higher than the detection level, and attains a low level when the boosted voltage $V_{PP}$ is higher than the detection level.

The operation of ring oscillator 2 will be described. When the output signal from detecting circuit 10 is at a high level, a logic level of an output signal of NAND gate 21 is inverted in a constant cycle owing to a loop circuit of NAND gate 21 and inverters 22 and 23. As a result, a logic level of an output signal from inverter 24 is inverted in a constant cycle.

On the other hand, when the output signal from detecting circuit 10 is at a low level, the output of NAND gate 21 is fixed to a high level. As a result, the logic level of the output signal from inverter 24 is fixed to a low level.

Therefore, the output signal of ring oscillator 2 becomes a pulse signal in which a logic level is inverted in a constant cycle when the output signal from detecting circuit 10 is at a high level, and becomes a signal which is fixed to a low level when the output signal from detecting circuit 10 is at a low level.

The operation of charge pump circuit 3 will be described. When the output signal of ring oscillator 2 is the pulse signal described above, it operates as follows.

When the output signal from ring oscillator 2 falls from a high level to a low level, the output signal is applied to capacitor 33 through inverters 31 and 32. Thus, the voltage of node N30 drops because of a capacitive coupling of capacitor 33.

Due to the voltage drop, the voltage of node N30 becomes lower than the voltage which is lower than the power supply voltage $V_{CC}$ by a threshold voltage $V_{TH}$ of transistor 34. Thus, transistor 34 is turned on resulting a voltage of node N30 being $V_{CC}-V_{TH}$.

When the output signal of ring oscillator 2 rises from a low level to a high level, the output signal is applied to capacitor 33 through inverters 31 and 32. Thus, the voltage of node N30 rises because of the capacitive coupling of capacitor 33.

Due to the voltage rise, the voltage of node N30 rises by the power supply voltage $V_{CC}$. As a result, the voltage of node N30 attains $2V_{CC}-V_{TH}$. In this state, transistor 35 is turned on. As a result, the boosted voltage $V_{PP}$ which is a voltage of output node N3 becomes lower than the voltage of node N30 by a threshold value $V_{TH}$ of transistor 35, that is, $2V_{CC}-2V_{TH}$.

Therefore, when a pulse signal is applied to charge pump circuit 3, charge pump circuit 3 operates to rise the boosted voltage $V_{PP}$. On the other hand, when a signal applied to charge pump circuit 3 is fixed to a low level, charge pump circuit 3 does not operate to rise the boosted voltage $V_{PP}$.

The operation of clamping circuit 400 will be described. In clamping circuit 400, a clamp level is set according to the total value of threshold voltages $V_{TH}$ of respective transistors 41 in group of transistors 410. The clamp level is a reference voltage for clamping the boosted voltage $V_{PP}$ at a constant value when the boosted voltage $V_{PP}$ becomes higher than a predetermined value. Specifically, the clamp level is a voltage which is higher than a ground voltage by the total value of threshold voltages $V_{TH}$ of the transistors 41.

In clamping circuit 400, when the voltage of output node N3, i.e., the boosted voltage $V_{PP}$ exceeds the clamp level, each transistor 41 in group of transistors 410 is turned on to discharge output node N3 to clamp the boosted voltage $V_{PP}$ at the clamp level.

Summary of the operation of the voltage generation circuit described above is as follows.

When the boosted voltage $V_{PP}$ is lower than the detection level, a control signal is applied to charge pump circuit 3 through ring oscillator 2 from detecting circuit 10, and charge pump circuit 3 operates to rise the boosted voltage $V_{PP}$. On the other hand, when the boosted voltage $V_{PP}$ is higher than the clamp level, clamping circuit 400 operates to clamp the boosted voltage $V_{PP}$ at the clamp level.

Figure 8:
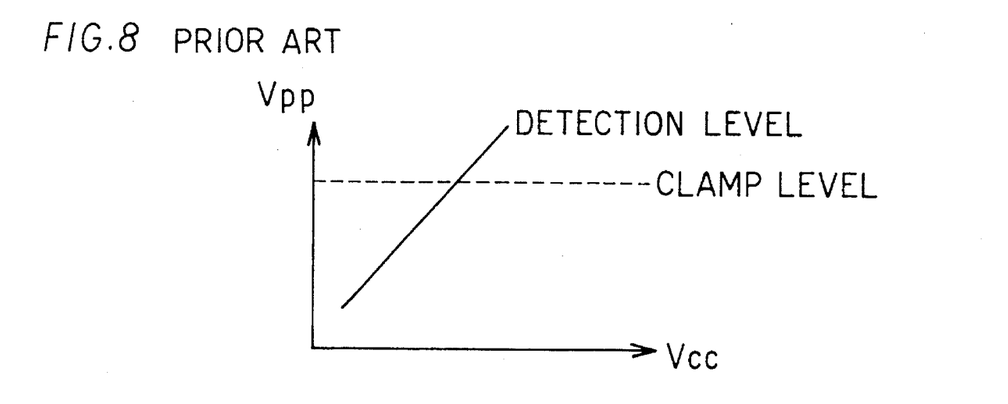
FIG. 8 is a graph showing the relation of a detection level and a clamp level in the voltage generation circuit shown in FIG. 7.

Relation of the detection level and the clamp level will be described. FIG. 8 is a graph showing the relation of the detection level and the clamp level. In FIG. 8, the ordinate indicates the boosted voltage $V_{PP}$ and the abscissa indicates the power supply voltage $V_{CC}$. The detection level is indicated as a solid line and the clamp level is indicated as a broken line.

Referring to FIG. 8, since the detection level is set based on the power supply voltage $V_{CC}$ and threshold voltages $V_{TH}$ of transistors 11 and 12, it rises as the power supply voltage $V_{CC}$ rises. On the other hand, since the clamp level is set based on the total value of the threshold voltages $V_{TH}$ of transistors 41 in group of transistors 410, it is constant independent of the power supply voltage $V_{CC}$.

Hence, when the detection level is set lower than the clamp level, charge pump circuit 3 and clamping circuit 400 do not operate at the same time in the voltage generation circuit, and normal operation is carried out.

However, there are cases where the detection level is set higher than the clamp level according to the rise of the power supply voltage $V_{CC}$ shown in FIG. 8. In such cases, charge pump circuit 3 may possibly operate for boosting even though clamping circuit 400 is in operation for clamping. That is, clamping circuit 400 and charge pump circuit 3 operate at the same time.

Thus, in a conventional voltage generation circuit, there may be a case where the clamping circuit and charge pump circuit 3 operate at the same time, which causes unnecessary power consumption, resulting in the increase of power consumption.

SUMMARY OF THE INVENTION

One object of the present invention is to reduce power consumption of a voltage generation circuit.

Another object is to reduce unnecessary power consumption of the voltage generation circuit when the power supply voltage rises.

A voltage generation circuit in accordance with the invention includes a detecting circuit, a clamping circuit and a charge pump circuit. The detecting circuit includes a circuit for stopping supply of a control signal (hereinafter, referred to as a stop circuit).

The charge pump circuit generates an output voltage in response to a control signal. The clamping circuit clamps the output voltage to a fixed first reference voltage independent of a power supply voltage when the output voltage becomes higher than the first reference voltage.

The detecting circuit detects the output voltage and supplies a control signal for boosting the output voltage to the charge pump circuit when the detected output voltage becomes lower than a second reference voltage which is set based on the power supply voltage. The stop circuit included in the detecting circuit stops supplying a control signal when the clamping circuit is in operation.

Thus, when the clamping circuit operates for clamping, the control signal supplied to the charge pump circuit from the detecting circuit is stopped by the stop circuit. As a result, even in case the second reference voltage changes according to change of the power supply voltage, the charge pump circuit can be stopped when the clamping circuit is in operation.

Therefore, the clamping circuit and the charge pump circuit do not operate at the same time and unnecessary power consumption can be reduced in case the power supply voltage rises. As a result, power consumption of the voltage generation circuit can be reduced.

A voltage generation circuit in accordance with another aspect of the invention includes a charge pump circuit, a clamping circuit and a detecting circuit. The detecting circuit includes a circuit for stopping supply of a control signal (stop circuit).

The charge pump circuit generates an output voltage in response to a control signal. The clamping circuit clamps the output voltage to a fixed first reference voltage independent of a power supply voltage when the output voltage of the charge pump circuit becomes lower than the first reference voltage.

The detecting circuit detects the output voltage of the charge pump circuit and supplies a control signal for down-converting the output voltage to the charge pump circuit when the detected output voltage becomes higher than a second reference voltage which is set based on the power supply voltage. The stop circuit included in the detecting circuit stops supply of a control signal when the clamping circuit is in operation.

Thus, when the clamping circuit is in operation, the control signal supplied to the charge pump circuit from the detecting circuit is stopped by the stop circuit. As a result, even in case the second reference voltage changes according to change of the power supply voltage, the charge pump circuit is stopped when the clamping circuit is in operation.

Therefore, the clamping circuit and the charge pump circuit do not operate at the same time and unnecessary power consumption caused by the decrease of the power supply voltage can be reduced. As a result, power consumption of the voltage generation circuit can be reduced.

A voltage generation circuit in accordance with still another aspect of the invention includes a charge pump circuit, a clamping circuit and a detecting circuit. The detecting circuit includes a circuit for stopping supply of a control signal (stop circuit).

The charge pump circuit generates an output voltage in response to the control signal. The clamping circuit clamps the output voltage to a fixed first reference voltage independent of a power supply voltage when the absolute value of the output voltage of the charge pump circuit exceeds the absolute value of the first reference voltage.

The detecting circuit detects the output voltage of the charge pump circuit and supplies a control signal for increasing the absolute value of the output voltage to the charge pump circuit when the absolute value of the detected output voltage becomes smaller than the absolute value of a second reference voltage which is set based on the power supply voltage. The stop circuit included in the detecting circuit stops supply of the control signal when the clamping circuit is in operation.

Thus, when the clamping circuit is in operation, a control signal supplied to the charge pump circuit from the detecting circuit is stopped by the stop circuit. As a result, even in case that the second reference voltage changes according to change of the power supply voltage, the charge pump circuit is stopped when the clamping circuit is in operation.

Therefore, the clamping circuit and the charge pump circuit do not operate at the same time, and unnecessary power consumption can be reduced in case the power supply voltage rises. As a result, power consumption of the voltage generation circuit can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail in the following, with reference to the figures.

FIRST EMBODIMENT

Figure 1:
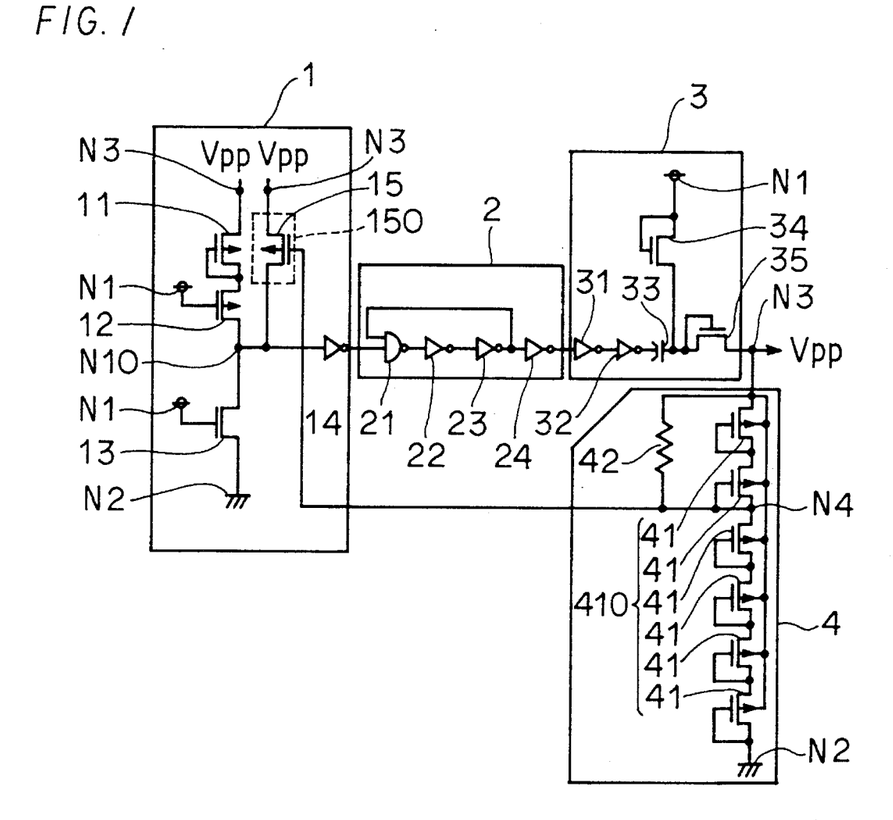
FIG. 1 is a circuit diagram of a voltage generation circuit in accordance with a first embodiment of the present invention.

FIG. 1 is a circuit diagram of a voltage generation circuit in accordance with a first embodiment. Referring to FIG. 1, the voltage generation circuit shown in FIG. 1 is different from the voltage generation circuit shown in FIG. 7 in that a detecting circuit 1 includes a circuit 150 for stopping supply of a control signal (hereinafter referred to as stop circuit 150), that a clamping circuit 4 outputs a constant voltage VG1 and that clamping circuit 4 includes a resistor 42.

In clamping circuit 4, a node N4 (hereinafter referred to as a voltage output node) between a second nearest transistor 41 and a third nearest transistor 41 to an output node N3 outputs a constant voltage VG1. In other words, a voltage VG1 which is equal to a gate voltage of the second nearest transistor 41 to the output node N3 is output. Furthermore, resistor 42 is connected between the output node N3 and the voltage output node N4. Stop circuit 150 includes a P channel transistor 15. Transistor 15 is connected between the output node N3 and a node N10. The gate of transistor 15 receives a constant voltage VG1 output from clamping circuit 4.

The operation of the voltage generation circuit shown in FIG. 1 will be described. Note that the same operation as that of the voltage generation circuit shown in FIG. 7 will not be described.

A clamp level in clamping circuit, when represented on the basis of the constant voltage VG1, is the constant voltage VG1 plus the total value of absolute values of threshold voltages of two transistors 41, $2|V_{TH}|$, i.e., VG1 $+2|V_{TH}|$.

Transistor 15 in detecting circuit 1 receives a constant voltage VG1 at its gate. Therefore transistor 15 is turned on when a boosted voltage $V_{PP}$ becomes higher than the total value, VG1+$|V_{TH}|$, of a constant voltage VG1 and the absolute value of the threshold voltage of transistor 15, $|V_{TH}|$. When transistor 15 is turned on, a logic level of the node N10 attains a high level independent of the operation states of transistors 11 and 12. As a result, charge pump circuit 3 is forced to stop by a control signal applied to charge pump circuit 3 through ring oscillator 2 from detecting circuit 1.

Resistor 42 in clamping circuit 4 is provided to prevent turn on of transistor 15 when the constant voltage VG1 is lower than the boosted voltage $V_{PP}$ at the time of turn on of the power supply. More specifically, when the power supply is turned on, the boosted voltage $V_{PP}$ is 0 volt. In such a case, since resistor 42 is provided, the constant voltage VG1 will be a voltage near to 0 V. As a result, charge pump 3 is not forced to stop when the power supply is turned on.

Thus, detecting circuit 1 has two detection levels a first detection level $V_{CC}+2|V_{TH}|$ and a second detection level VG1+$|V_{TH}|$.

Figure 2:
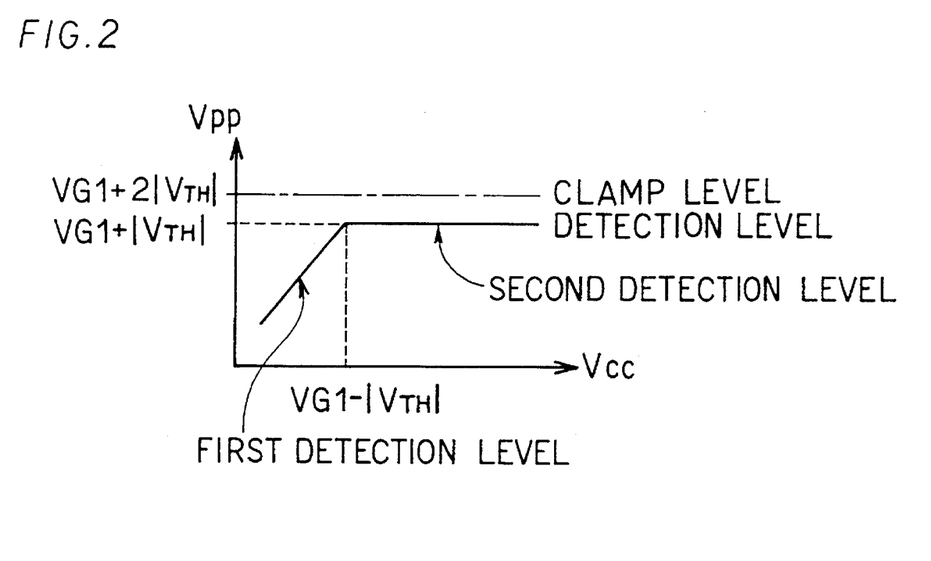
FIG. 2 is a graph showing the relation of a detection level and a clamp level in the voltage generation circuit shown in FIG. 1.

The relation of the first detection level and the second detection level is as follows. FIG. 2 is a graph showing the relation of the detection level and the clamp level in the voltage generation circuit shown in FIG. 1. In FIG. 2, the ordinate indicates the boosted voltage $V_{PP}$, and the abscissa indicates the power supply voltage $V_{CC}$. The detection level and the clamp level are represented by a solid line and a chain dotted line, respectively.

Referring to FIG. 2, the first detection level changes according to a power supply voltage $V_{CC}$. When the power supply voltage $V_{CC}$ is equal to a voltage of VG1–$|V_{TH}|$, the first detection level is VG1+$|V_{TH}|$, which is equal to the second detection level. Since the second detection level is set based on the threshold voltage of a transistor, it is fixed to a constant value independent of the power supply voltage $V_{CC}$.

When the power supply voltage $V_{CC}$ is lower than VG1–$|V_{TH}|$, the first detection level is lower than the second detection level. Therefore, detection is carried out based on the first detection level in detecting circuit 1. On the other hand, when the power supply voltage $V_{CC}$ is higher than $VG1-|V_{TH}|$, the second detection level is lower than the first detection level. Therefore, detection is carried out based on the second detection level.

Thus, the detection level of detecting circuit 1 rises when the first detection level rises according to the rise of the power supply voltage $V_{CC}$, and when the first detection level attains the second detection level, it is fixed to the second detection level even though the power supply voltage $V_{CC}$ further rises. Therefore, the detection level may not be higher than the clamp level even though the power supply voltage $V_{CC}$ rises. As a result, the boosting operation of the boosted voltage $V_{PP}$ by charge pump circuit 3 and clamp operation by clamping circuit 4 can be prevented from being carried out at the same time. Therefore, unnecessary power consumption can be reduced when the power supply voltage $V_{CC}$ rises resulting in reduced power consumption of the voltage generation circuit.

SECOND EMBODIMENT

Figure 3:
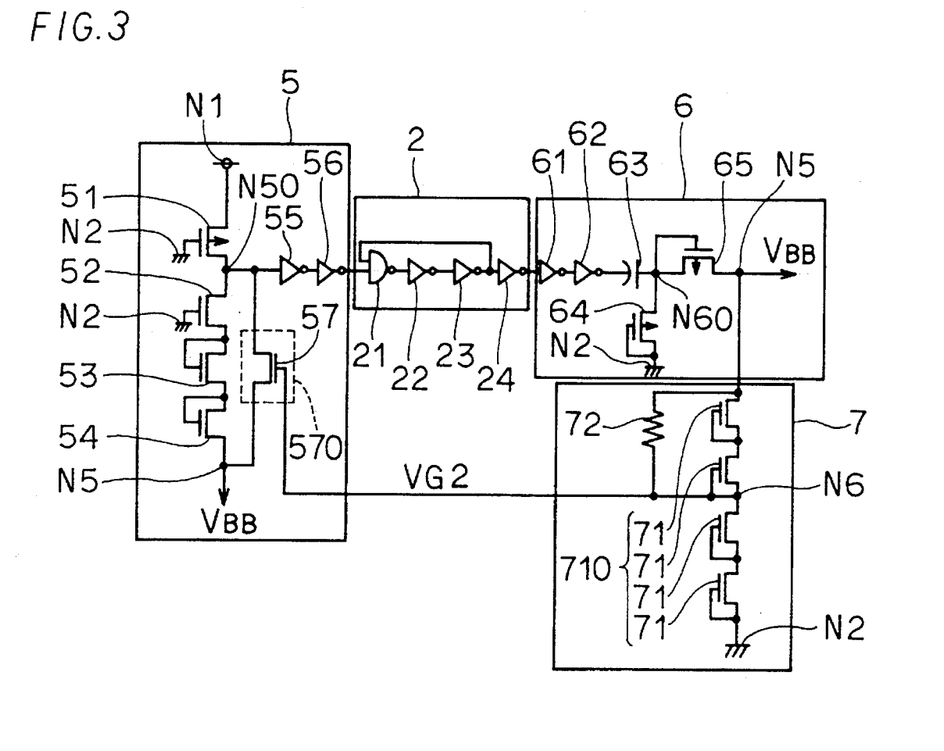
FIG. 3 is a circuit diagram of a voltage generation circuit in accordance with a second embodiment of the present invention.

A second embodiment will be described. In the second embodiment, a voltage generation circuit for generating a substrate voltage $V_{BB}$ will be described. FIG. 3 is a schematic diagram of a voltage generation circuit in accordance with the second embodiment. The voltage generation circuit includes a detecting circuit 5, a ring oscillator 2, a charge pump circuit 6 and a clamping circuit 7.

A power supply node N1 receives a power supply voltage $V_{CC}$. A ground node N2 receives a ground voltage. An output node N5 receives and outputs the substrate voltage $V_{BB}$ which is an output voltage from charge pump circuit 6.

Detecting circuit 5 includes a P channel transistor 51, N channel transistors 52, 53, 54 and 57, and inverters 55 and 56. Transistor 57 constitutes a circuit 570 for stopping supply of a control signal.

Transistors 51, 52, 53 and 54 are connected in series between the power supply node N1 and the output node N5. Transistors 51 and 52 have their gates connected to the ground node N2 respectively. Transistor 53 has its gate connected to a node between transistors 52 and 53. Transistor 54 has its gate connected to a node between transistors 53 and 54.

Transistor 57 is connected between a node N50 between transistors 51 and 52, and a voltage output node N3. Transistor 57 receives a constant voltage VG2, which will be described later, at its gate. The node N50 is connected to one input node of an NAND gate 21 of ring oscillator 2 through inverters 55 and 56.

Description of ring oscillator 2 which is the same as shown in FIG. 1 will not be repeated. Ring oscillator 2 is connected between an inverter 56 in detecting circuit 5 and an inverter 61 in charge pump circuit 6 which will be described later.

Charge pump circuit 6 includes inverters 61 and 62, a capacitor 63, and P channel transistors 64 and 65. Inverters 61 and 62, capacitor 63 and transistor 65 are connected in series between inverter 24 in ring oscillator 2 and the output node N5. Transistor 65 has its gate connected to a node N60 between capacitor 63 and transistor 65. Transistor 64 is connected between the ground node N2 and the node N60. Transistor 64 has its gate connected to the ground node N2.

Clamping circuit 7 includes a group of transistors 710 connected between the output node N5 and the ground node N2. The group of transistors 710 includes four N channel transistors 71. These transistors 71 are connected in series between the output node N5 and the ground node N2.

In the group of transistors 710, a transistor 71 which is connected to the ground node N2 has its gate connected to the ground node N2. Each of the remaining transistors 71 has its gate connected to each node between that transistor 71 itself and an adjacent transistor 71 at the side of the ground node N2. A constant voltage VG2 is applied to the gate of transistor 57 from a node N6 (hereinafter referred to as a voltage output node) between transistor 71 which is second nearest to the output node N5 and transistor 71 which is third nearest. Also, a resistor 72 is connected between the output node N5 and the voltage output node N6.

The operation of the voltage generation circuit will be described.

At first, the operation of a detecting circuit 5 will be described. In detecting circuit 5, a first detection level is set based on the power supply voltage $V_{CC}$ and the threshold voltages $V_{TH}$ of respective transistors 52, 53 and 54. In this case, by limiting a current flowing in transistor 51, a current flow in transistors 52, 53 and 54 is determined, and by appropriately setting the size of respective transistors 52, 53 and 54, the first detection level is adjusted to be set to a desired value.

A second detection level is set based on a constant voltage VG2 and threshold voltage $V_{TH}$ of transistor 57. A detection level of detecting circuit 5 is set based on a combination of the first and second detection levels. The detection level is a reference voltage for detection as to whether substrate voltage $V_{BB}$ has become lower than a predetermined value.

In detecting circuit 5, transistor 51 is normally in on-state. When the substrate voltage $V_{BB}$ is not lower than the detection level, transistors 52, 53, and 54 are all turned off. In this case, a logic level of the node N50 attains a high level, and as a result, a logic level of an output signal from inverter 56 attains a high level.

On the other hand, when the substrate voltage $V_{BB}$ is lower than the detection level, transistors 52, 53 and 54 are all turned on. In this case, the logic level of the node N50 attains a low level, and as a result, the logic level of the output signal from inverter 56 attains a low level.

Therefore, an output signal from detecting circuit 5 attains a high level when the substrate voltage $V_{BB}$ is not lower than the detection level, and attains a low level when the substrate voltage $V_{BB}$ is lower than the detection level.

The detailed description of the operation of ring oscillator 2 will not be repeated since it is the same as the ring oscillator 2 in the voltage generation circuit in FIG. 7. An output signal from ring oscillator 2 becomes a pulse signal, a logic level of which inverts in a constant cycle when the output signal of detecting circuit 5 is a high level, and is fixed to a low level when the output signal from detecting circuit 5 is a low level.

The operation of charge pump circuit 6 will be described. When the output signal from ring oscillator 2 is a pulse signal, the operation is as follows.

When the output signal from ring oscillator 2 rises from a low level to a high level, the output signal is applied to a capacitor 63 through inverters 61 and 62. Therefore, a voltage of node N60 rises due to a capacitive coupling of capacitor 63.

The voltage of node N60 becomes higher than the threshold voltage $V_{TH}$ of transistor 64 due to the voltage rise. Therefore, transistor 64 is turned on, so that the voltage of node N60 attains $V_{TH}$.

When the output signal of ring oscillator 2 falls from a high level to a low level, the output signal is applied to capacitor 63 through inverters 61 and 62. Therefore, the voltage of node N60 decreases due to the capacitive coupling of capacitor 63.

The voltage of node N60 decreases by $V_{CC}$ due to the voltage decrease. As a result, the voltage of node N60 attains $V_{TH}-V_{CC}$. In this state, transistor 65 is turned on. As a result, the substrate voltage $V_{BB}$ which is a voltage of the output node N5 attains $2V_{TH}-V_{CC}$ which is higher than the voltage of node N60 by the threshold voltage $V_{TH}$ of transistor 65.

Therefore, when a pulse signal is applied to charge pump circuit 6, charge pump circuit 6 operates to decrease the substrate voltage $V_{BB}$. On the other hand, when the signal applied to charge pump circuit 6 is fixed to a low level, charge pump circuit 6 does not operate to decrease the substrate voltage $V_{BB}$.

The operation of clamping circuit 7 will be described. In clamping circuit 7, the clamp level is set based on the total value of threshold voltages $V_{TH}$ of transistors 71 of the group of transistors 710. The clamp level is a reference voltage to clamp the substrate voltage $V_{BB}$ to a constant value when the substrate voltage $V_{BB}$ becomes lower than a predetermined value. More specifically, the clamp level is the reference voltage which is lower than the ground voltage by the total value of threshold voltages $V_{TH}$ of transistors 71.

In clamping circuit 7, when the voltage of output node N5, i.e. the substrate voltage $V_{BB}$ becomes lower than the clamp level, each of the group of the transistors 710 is turned on to charge the output node N5 and clamp the substrate voltage $V_{BB}$ to the clamp level.

Also in clamp circuit 7, a constant voltage VG2 is output from node N6. In other words, a constant voltage VG2 which is equal to a gate voltage of transistor 71 which is second nearest to the voltage output node N5 is output.

When represented on the basis of the constant voltage VG2, the clamp level of clamping circuit 7 is VG2–$2V_{TH}$, that is, lower than the constant voltage VG2 by the total value of threshold voltages of two transistors 71, $2V_{TH}$.

Transistor 57 in detecting circuit 5 receives a constant voltage VG at its gate. Therefore, transistor 57 is turned on when the substrate voltage $V_{BB}$ is lower than VG2 –$V_{TH}$.

When transistor 57 is turned on, a logic level of node N50 attains a low level independent of the operating states of transistors 52, 53 and 54. As a result, charge pump circuit 6 is forced to stop by a control signal applied to charge pump circuit 6 through ring oscillator 2 from detecting circuit 5.

A resistor 72 is provided to prevent turning on of transistor 57 when the constant voltage VG2 attains higher than the substrate voltage $V_{BB}$ at the time of turn on of the power supply voltage. Specifically, when the power supply is turned on, the substrate voltage $V_{BB}$ becomes 0V. In this case, since resistor 72 is provided, a constant voltage VG is a voltage near to 0 V. As a result, when the power supply is turned on, charge pump circuit 6 is not forced to stop.

Figure 4:
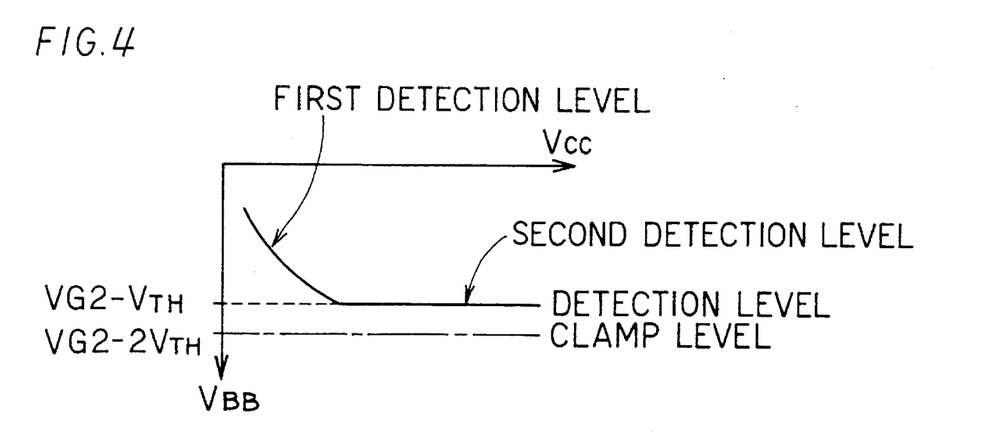
FIG. 4 is a graph showing the relation of a detection level and a clamp level in the voltage generation circuit shown in FIG. 3.

The relation between the first and the second detection levels in detecting circuit 5 will be described. FIG. 4 is a graph showing the relation between the detection level and the clamp level in the voltage generation circuit shown in FIG. 3. In FIG. 4, the ordinate and the abscissa indicate the substrate voltage $V_{BB}$ and the power supply voltage $V_{CC}$, respectively, and the detection level and the clamp level are represented by a solid line and a chain-dotted line, respectively.

Referring to FIG. 4, the first detection level changes according to the power supply voltage $V_{CC}$. The detection level of detecting circuit 5 decreases according to the decrease of the first detection level as the power supply voltage $V_{CC}$ increases. Since the second detection level is set based on a threshold voltage of a transistor, it is fixed to a constant value independent of the power supply voltage $V_{CC}$. When the first detection level attains the second detection level, the detection level of detecting circuit 5 is fixed to the second detection level even though the power supply voltage $V_{CC}$ increases. Therefore, the detection level will not become lower than the clamp level even though the power supply voltage $V_{CC}$ increases.

As a result, down-converting of the substrate voltage $V_{BB}$ by charge pump circuit 6 and clamping by clamping circuit 7 are prevented from being carried out at the same time. Therefore, unnecessary power consumption can be reduced when the power supply voltage $V_{CC}$ increases, resulting in the reduction of power consumption of the voltage generation circuit.

THIRD EMBODIMENT

Figure 5:
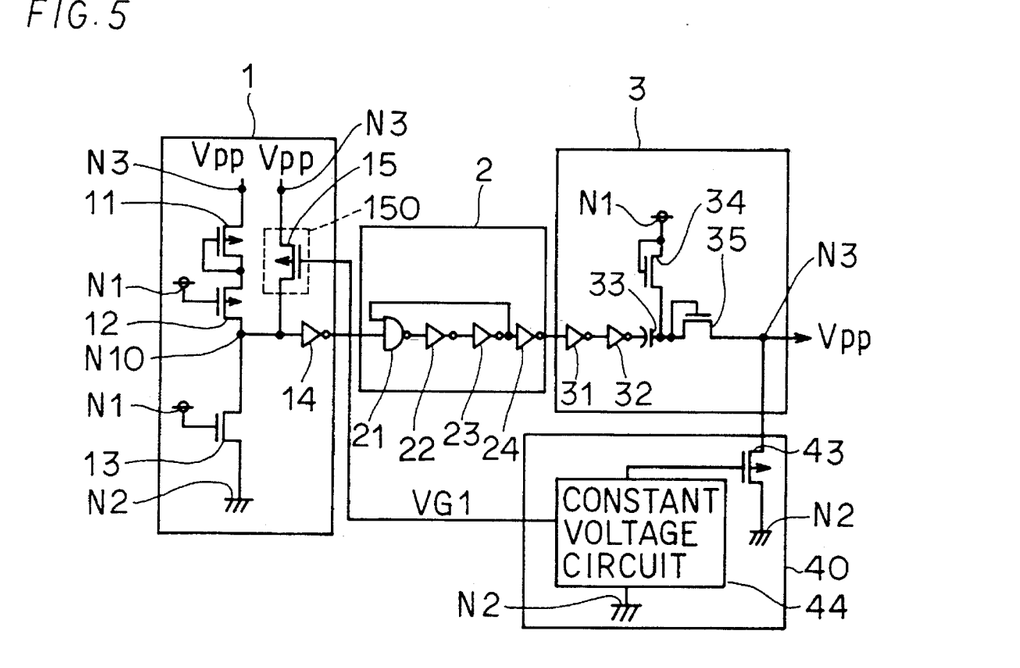
FIG. 5 is a circuit diagram of a voltage generation circuit in accordance with a third embodiment of the present invention.

The third embodiment will be described next. FIG. 5 is a schematic diagram of a voltage generation circuit according to the third embodiment. Referring to FIG. 5, the voltage generation circuit in FIG. 5 is different from the voltage generation circuit in FIG. 1 in a structure of a clamping circuit 40.

Clamping circuit 40 includes a P channel transistor 43 and a constant voltage circuit 44. Transistor 43 is connected between an output node N3 and a ground node N2. Constant voltage circuit 44 generates plural types of constant voltages. Respective constant voltages generated from constant voltage circuit 44 are applied to respective gates of transistors 15 and 43.

The operation of the voltage generation circuit in FIG. 5 will be described. Constant voltage circuit 44 applies a constant voltage VG1 which is the same as the constant voltage VG1 generated in the voltage generation circuit in FIG. 1 to a gate of a transistor. Further, constant voltage circuit 44 applies a voltage which is higher than the constant voltage VG1 by a voltage corresponding to the threshold voltage $V_{TH}$ of transistor to the gate of transistor 43. Thus, in the voltage generation circuit in FIG. 5, the second detection level and the clamp level which are the same as those in the voltage generation circuit in FIG. 1 are set. Therefore, the voltage generation circuit in FIG. 5 operates in the same manner as the voltage generation circuit in FIG. 1.

FOURTH EMBODIMENT

Figure 6:
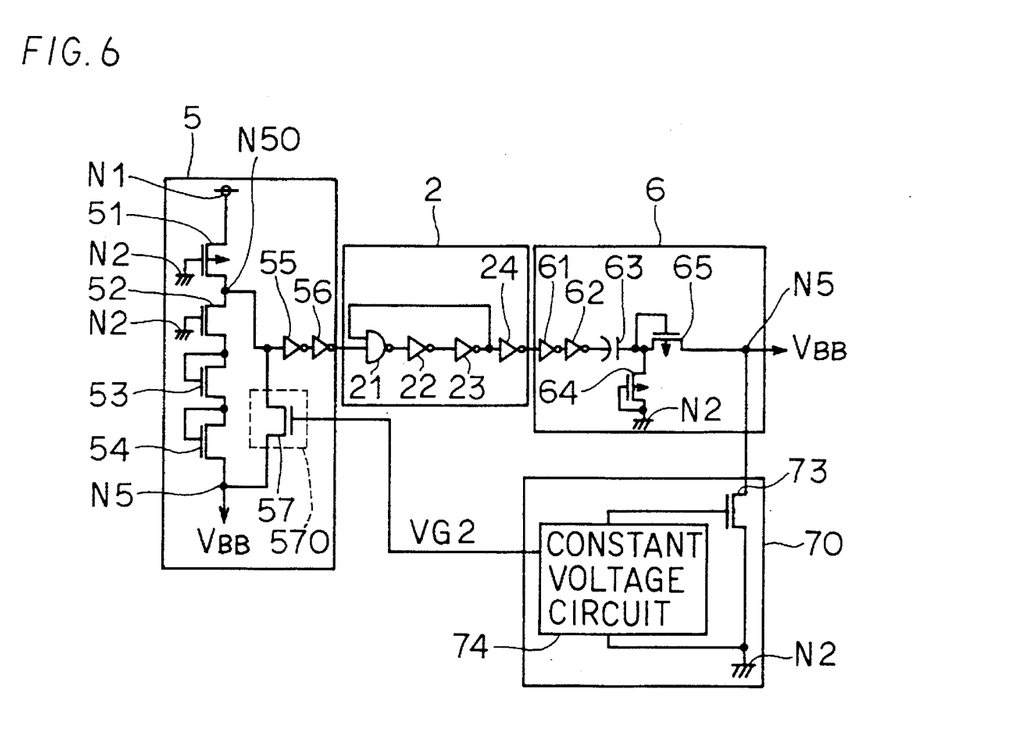
FIG. 6 is a circuit diagram of a voltage generation circuit in accordance with a fourth embodiment of the present invention.

The fourth embodiment will be described. FIG. 6 is a circuit diagram of a generation circuit according to the fourth embodiment. Referring to FIG. 6, the voltage generation circuit in FIG. 6 is different from the voltage generation circuit in FIG. 3 in the structure of clamping circuit 70.

Clamping circuit 70 includes an N channel transistor 73 and a constant voltage circuit 74. Transistor 73 is connected between an output node N5 and a ground node N2. Constant voltage circuit 74 generates plurality types of constant voltages. Respective constant voltages generated in constant voltage generation circuit 74 are applied to respective gates of transistors 57 and 73.

The operation of a voltage generation circuit in FIG. 6 will be described.

Constant voltage circuit 74 applies a constant voltage VG2 which is the same as the constant voltage VG2 generated in the voltage generation circuit in FIG. 3 to a gate of transistor 57. Constant voltage circuit 74 also applies a voltage which is lower than the constant voltage VG2 by a voltage corresponding to a threshold voltage $V_{TH}$ of a transistor to the gate of transistor 73.

Therefore, in the voltage generation circuit in FIG. 6, the second detection level and the clamp level which are the same as those of voltage generation circuit in FIG. 3 are set. Therefore, the voltage generation circuit in FIG. 6 operates in the same manner as that in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generation circuit, comprising:

charge pump means responsive to a control signal for generating an output voltage;

clamping means for clamping said output voltage to a fixed first reference voltage independent of a power supply voltage when said output voltage becomes higher than said first reference voltage; and detecting means for detecting said output voltage and for applying a control signal for increasing said output voltage to said charge pump means when the detected output voltage becomes lower than a second reference voltage which is set based on said power supply voltage, wherein said detecting means comprises means for stopping supply of said control signal when said clamping means is in operation.

2. A voltage generation circuit according to claim 1, further comprising:

a power supply node for receiving said power supply voltage;

an output node for outputting said output voltage of said charge pump means; and a ground node for receiving a ground voltage;

wherein said detecting means further comprises transistor means provided between said output node and said ground node for receiving said power supply voltage, setting said second reference voltage based on the power supply voltage and generating said control signal as a logic signal.

3. A voltage generation circuit according to claim 1, further comprising:

an output node for outputting said output voltage of said charge pump means; and a ground node for receiving a ground voltage;

wherein said clamping means includes a group of transistors including a plurality of first transistors connected in series between said output node and said ground node, for setting said first reference voltage based on threshold voltages of the transistors and generating a third reference voltage which is lower than said first reference voltage to discharge said output node when said output voltage is higher than said first reference voltage;

wherein said means for stopping supply of a control signal includes a second transistor receiving said third reference voltage generated from said group of transistors for stopping supply of said control signal in response to said third reference voltage.

4. A voltage generation circuit according to claim 3, wherein said clamping means further includes:

a voltage output node provided between any two of transistors of said group of transistors for outputting said third reference voltage; and resistor means provided between said output node and said voltage output node.

5. A voltage generation circuit according to claim 1, further comprising:

an output node for outputting said output voltage of charge pump means; and a ground node for receiving a ground voltage;

wherein said clamping means includes:

constant voltage means for generating a constant voltage; and a first transistor provided between said output node and said ground node for receiving the generated voltage of said constant voltage means for generating said first reference voltage based on the generated voltage and its threshold voltage to discharge said output node when said output voltage is higher than said first reference voltage; and wherein said means for stopping supply of the control signal includes a second transistor for receiving the generated voltage of said constant voltage means to stop supply of said control signal in response to the generated voltage.

6. A voltage generation circuit, comprising:

charge pump means for generating an output voltage in response to a control signal;

clamping means for clamping said output voltage to a fixed first reference voltage independent of a power supply voltage when said output voltage becomes lower than said first reference voltage; and detecting means for detecting said output voltage and for applying a control signal for down-converting said output voltage to said charge pump means when the detected output voltage becomes higher than a second reference voltage which is set based on said power supply voltage, wherein said detecting means includes, means for stopping supply of said control signal when said clamping means is in operation.

7. A voltage generation circuit according to claim 6, further comprising:

a power supply node for receiving said power supply voltage;

an output node for outputting said output voltage of said charge pump means; and a ground node for receiving a ground voltage;

wherein said detecting means further includes, transistor means provided between said output node and aid power supply node for receiving said ground voltage, setting said second reference voltage based on said power supply voltage and generating said control signal as a logic signal.

8. A voltage generation circuit according to claim 6, further comprising:

an output node for outputting said output voltage of said charge pump means; and a ground node for receiving a ground voltage;

wherein said clamping means includes a group of transistors including a plurality of first transistors connected in series between said output node and said ground node for setting said first reference voltage based on threshold voltages of the transistors for generating a third reference voltage which is higher than said first reference voltage to charge said output node when said output voltage is lower than said first reference voltage; and wherein said means for stopping supply of the control signal includes, a second transistor for receiving said third reference voltage generated from said group of transistors for stopping supply of said control signal in response to the third reference voltage.

9. A voltage generation circuit according to claim 8, wherein said clamping means further includes:

a voltage output node provided between any two of transistors of said group of transistors for outputting said third reference voltage; and resistor means provided between said output node and said voltage output node.

10. A voltage generation circuit according to claim 6, further comprising:

an output node for outputting said output voltage of said charge pump means; and a ground node for receiving a ground voltage;

wherein said clamping means includes, constant voltage means for generating a constant voltage; and a first transistor provided between said output node and said ground node for receiving the voltage generated from said constant voltage means to generate said first reference voltage based on the generated voltage and a threshold voltage to charge said output node when said output voltage is lower than said first reference voltage;

wherein said means for stopping supply of a control signal includes, a second transistor receiving the voltage generated from said constant voltage means to stop supply of said control signal in response to the generated voltage.

11. A voltage generation circuit, comprising:

charge pump means for generating an output voltage in response to a control signal;

clamping means for clamping said output voltage to a fixed first reference voltage independent of a power supply voltage when the absolute value of said output voltage exceeds that of said first reference voltage; and detecting means for detecting said output voltage and for applying a control signal for increasing the absolute value of said output voltage to said charge pump means when the absolute value of detected output voltage becomes smaller than that of a second reference voltage which is set based on said power supply voltage, wherein said detecting means includes, means for stopping supply of said control signal when said clamping means is in operation.

\* \* \* \* \*